United States Patent [19]
Becker et al.

[11] Patent Number: 5,691,246
[45] Date of Patent: Nov. 25, 1997

[54] IN SITU ETCH PROCESS FOR INSULATING AND CONDUCTIVE MATERIALS

[75] Inventors: David S. Becker; Guy T. Blalock, both of Boise, Id.

[73] Assignee: Micron Technology, Inc., Boise, Id.

[21] Appl. No.: 60,902

[22] Filed: May 13, 1993

[51] Int. Cl.$^6$ ................................ H01L 21/70
[52] U.S. Cl. ............ 437/225; 156/656.1; 156/657.1; 156/662.1; 156/643.1
[58] Field of Search .................. 156/643.1, 646.1, 156/656.1, 657.1, 662.1; 437/225

[56] References Cited

U.S. PATENT DOCUMENTS

| | | | |
|---|---|---|---|
| 4,939,105 | 7/1990 | Langley | 437/228 |
| 5,013,398 | 5/1991 | Long | 156/643 |
| 5,094,712 | 3/1992 | Becker | 156/643 |
| 5,096,536 | 3/1992 | Cathey | 156/643 |
| 5,110,411 | 5/1992 | Long | 156/656 |
| 5,201,993 | 4/1993 | Langley | 156/643 |
| 5,330,928 | 7/1994 | Tseng | 437/52 |

OTHER PUBLICATIONS

David S. Becker and Guy Blalock, "A Method of Obtaining High Oxide to Nitride Selectivity in an MERIE Reactor", *Electrochemical Society, Inc. Conference*, May 1993, pp. 367–368.

K.H. Kusters and W. Sesselmann, "A Stacked Capacitor Cell with a Fully Self–Aligned Contact Process for High–Density Dynamic Random Access Memories", *J. Electrochem, Soc.*, vol. 139, No. 8, Aug. 1992, pp. 2318–2320.

H. Itoh, Y. Miyagawa, M. Takahashi, T. Mitsuhashi. Y. Kimura, A. Endoh, Y. Nagatomo, M. Yoshimaru, F. Ichikawa, M. Ino, "*1991 Symposium On VLSI Technology—Digest Of Technical Papers*", IEEE Cat. No. 91 Ch 3017–1, pp. 9–10.

*Primary Examiner*—R. Bruce Breneman
*Assistant Examiner*—George Goudreau

[57] ABSTRACT

A method of etching an oxide/poly/oxide sandwich structure in which both oxide layers are anisotropically etched, and the poly layer is also isotropically etched to recess the poly from the edge of the contact walls. The oxide etch can be done using oxide to nitride etch stop technology. The process is an in situ etch, that is, a single parallel plate plasma reactor is employed.

7 Claims, 2 Drawing Sheets

IN SITU ETCH PROCESS FOR INSULATING AND CONDUCTIVE MATERIALS

FIELD OF THE INVENTION

This invention relates to semiconductor manufacturing, and more particularly to an in situ method for etching insulating and conductive materials.

BACKGROUND OF THE INVENTION

An electronic circuit is chemically and physically integrated into a substrate, such as a silicon wafer by patterning regions in the substrate, and by patterning layers on the substrate. These regions and layers can be conductive, for conductor and resistor fabrication, or insulative, for insulator and capacitor fabrication. They can also be of differing conductivity types, which is essential for transistor and diode fabrication.

Degrees of resistance, capacitance, and conductivity are controllable, as are the physical dimensions and locations of the patterned regions and layers, making circuit integration possible. Fabrication can be quite complex and time consuming, and therefore expensive. It is thus a continuing quest of those in the semiconductor fabrication industry to reduce fabrication times and costs of such devices in order to increase profits. Any simplified processing step or combination of processes at a single location becomes a competitive advantage.

A common requirement in integrated circuit (IC) fabrication is the etching of a "sandwich" structure such as a layer of silicon dioxide ("oxide") over a layer of polycrystalline silicon ("poly") over a layer of thin oxide (often called "gate oxide", because of its frequent use in transistor gates). Oxide is an insulator with dielectric properties. Poly is resistive in nature, but is made less resistive when doped with an element, such as phosphorus, having less or more than 4 valence electrons.

Two basic types of etch techniques can be used; chemical or "wet", and plasma or "dry". Etch chemistries for oxide and for poly are well known. Ordinarily, a mask layer is first deposited on a layer to be etched, and a mask opening made in the mask layer by photolithographic means, exposing a portion of the layer to be etched. An appropriate etch technique and chemistry is employed, which acts only on the exposed portion.

Difficulties may arise when more than one layer is desired etched at a single site because of different requirements for each: an etch chemistry for the bottom layer may interfere with a layer already etched through and exposed along the sidewall. Often these difficulties require changes between wet and dry techniques, and different types of etchers.

It is desirable to etch multiple layers at a single processing site. Less handling of the IC is required, which reduces handling errors, as well as the number of particle caused defects. Less masking steps may also be required, which directly reduces fabrication costs.

Both oxide and poly can be etched in a single parallel plate plasma reactor chamber. However, an oxide is typically etched in fluorine deficient fluorocarbon based plasmas, whereas poly is often etched in fluorine or chlorine based plasmas. Reactor electrode materials may also differ.

If a single-chamber process were attempted using conventional art to etch an oxide/poly sandwich structure, the erodible electrode required for oxide etch would be destroyed by the poly etchants. Using conventional methods, the two steps are not profitably compatible.

Some current manufacturing processes etch the oxide/poly/oxide structure in three separate etch chambers. Such technology involves etching the top oxide layer in an oxide etch chamber, then moving the wafer to a poly etch chamber for the poly etch, and then again moving the wafer back to the oxide chamber to etch the last oxide layer.

It is therefore desirable to etch an oxide/poly/oxide sandwich "in situ", that is, performing all required steps within a single etch chamber, under continuous vacuum conditions, in the same process run.

The following patents describe in situ etch processes of various conductive and insulative materials: U.S. Pat. No. 4,939,105 to Langley; U.S. Pat. No. 5,013,398 to Long, et al.; U.S. Pat. No. 5,094,712 to Becker, et al.; and application Ser. No. 07/382,403, all assigned to Micron Technology, Inc. The above-cited patents are all very worthwhile, describing anisotropic methods of etching.

The process of the present invention is also useful in etching contacts for metalization. The process of the present invention further provides for an isotropic polysilicon etch.

The polysilicon (which is a conductor) is undercut to provide some margin in which to place an insulating material, such as a nitride, thereby separating the polysilicon from the conductive material which is subsequently disposed in the contact hole created by the process of the present invention.

One embodiment of process of the present invention also includes a selective oxide to nitride etch chemistry (See also, "A Method of Obtaining High Oxide to Nitride Selectivity in an MERIE Reactor," *Electrochemical Society, Inc. Conference*, May 1993, authored by the inventors of the present application, as well as application Ser. No. 07/898,505 filed Jun. 15, 1992, and assigned to Micron Technology).

SUMMARY OF THE INVENTION

The process of the present invention provides for etching through and isotropically, undercutting a poly layer while etching an oxide/poly/oxide sandwich to form a contact. This etch is done in situ, that is, using a single parallel plate plasma reactor.

The process of the present invention is useful for etching an oxide/poly/oxide sandwich contact structure, and involves creating plasmas in which the oxide layers are anisotropically etched. Additionally, a plasma is created in which the poly layer is isotropically etched to recess the poly from the edge of the contact walls.

In one embodiment of the process of the present invention, the oxide layer superjacent the substrate is etched using an oxide to nitride etch stop technology.

Naturally, when one atmosphere is purged and another is introduced, a gas stability step is provided to guarantee a stable new atmosphere. These are well known to those familiar with this type of equipment and will not be further detailed.

One advantage of the process of the present invention is the reduced cycle time to accomplish contact hole formation.

Another advantage of the process of the present invention is the increase in yield which results from the reduction in defect densities. The wafer is handled less because the process is carried out in situ, thereby providing fewer opportunities for contamination.

BRIEF DESCRIPTION OF THE DRAWINGS

The present invention will be better understood from reading the following description of non-limitative

DETAILED DESCRIPTION OF THE INVENTION

Figure 1:
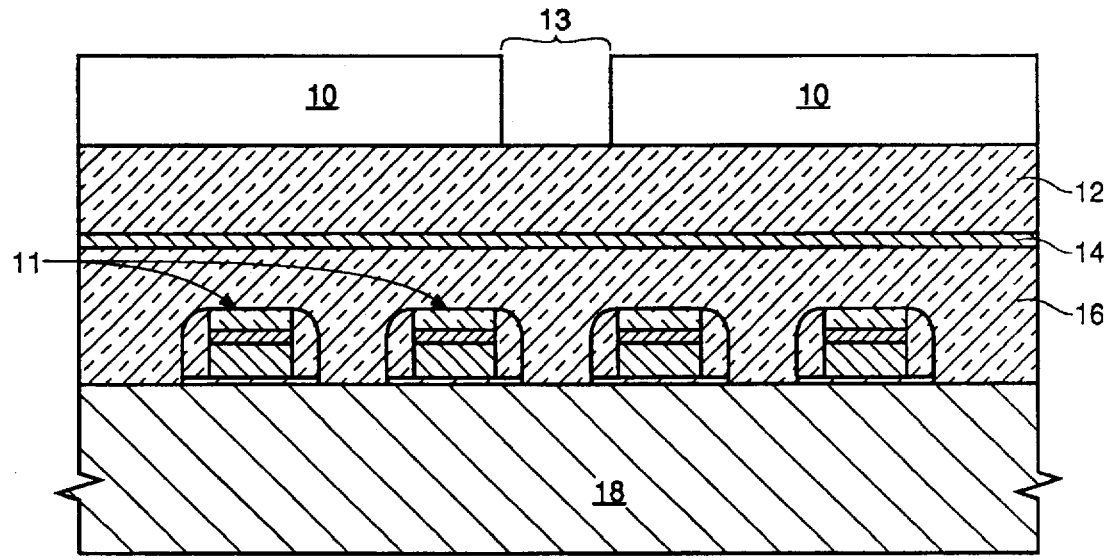
FIG. 1 is a schematic cross-section of a substrate having insulating and conductive layers and a patterned resist disposed thereon, according to the process of the present invention.

A photolithography process defines a contact hole 13 above the sandwich material comprising; an insulator 12, such as, an oxide or a nitride, including, but not limited to, silicon dioxide, TEOS, and BPSG; a conductive layer 14, such as polysilicon; and another insulator 16. The sandwich structure is disposed on a substrate 18 (in the illustrative embodiment, the substrate 18 is a silicon wafer, having a diameter of approximately 180 mm).

As illustrated in FIG. 1, a photoresist mask layer 10 is aligned and developed on a sandwich structure. In the preferred embodiment, the sandwich structure is comprised of an oxide layer 12 of approximately 10 kÅ, a poly layer 14 of approximately 1 kÅ, and a gate oxide layer 16 of approximately 10 kÅ, on a silicon wafer substrate 18. In the illustrative embodiment, the sandwich structure is disposed upon word lines 11 fabricated on the substrate 18.

The word lines 11 are comprised of an oxide or nitride/ $WSi_x$/poly, gate oxide which requires greater selectivity during the etch process which removes layer 16.

Deposition and masking of the sandwich structure are done by methods well known to those skilled in semiconductor design and processing, and hence, are not fully disclosed herein.

Oxide etch, in general, is fairly well understood, given a universal need for a vertical profile. This vertical profile is realized primarily by ion induced reaction with the oxide, coupled with normal incidence of the ions onto the oxide surface. The amount and energy of these ions are primarily controlled by the reactor's RF power and pressure.

Generally, a fluorocarbon-based gas mixture is introduced at a low pressure into the etch chamber. The exact gas composition is chosen, so that the fluorine-to-carbon ratio is near, but not beyond, the so-called polymerization point. Under these conditions, when a plasma is ignited, the fluorocarbons are dissociated and release fluorine radicals and $CF_x$ species.

Although fluorine radicals etch oxide, they do so very slowly: the primary etchant for oxide is considered to be the $CF_x$ species. Some of these species diffuse to the oxide surface where, with the assistance of ion bombardment, they react with the oxide and release volatile byproducts $SiF_4$, CO, and $CO_2$. In addition, some of the $CF_x$ species react with each other to form fluorocarbon polymers. Polymer that forms on horizontal surfaces is removed by vertical ion bombardment. Polymer that forms on vertical sidewalls is not significantly degraded by the bombardment, and actually serves a useful purpose by protecting the sidewalls from attack by the etchant species. This sidewall protection enables the achievement of vertical profiles, adjustable by varying the fluorine-to-carbon ratio. A polymer-producing gas such as $CHF_3$, is balanced against a fluorine producing gas such as $CF_4$, to provide proper selectivity, with assistance to sidewall protection.

A parallel-plate plasma reactor can etch both the oxide layers 12, 16 and the polysilicon layer 14 in one chamber. The preferred embodiment of the process of the present invention is done in an AME 5000 MERIE (magnetically enhanced reactive ion etching plasma reactor), sold by Applied Materials Corporation of Santa Clara, Calif. A fixed gap between an anodized aluminum cathode and the anode is preferred.

The wafers (substrate 18) sit on an O-ring in the chamber. There is a flow of helium to the back of the wafer 18 which provides a more consistent cooling of the wafer 18 during the plasma etch. This is a much superior method than just placing the wafer 18 on a water cooled electrode. This is also true with the poly 14 etch processes.

Figure 2:
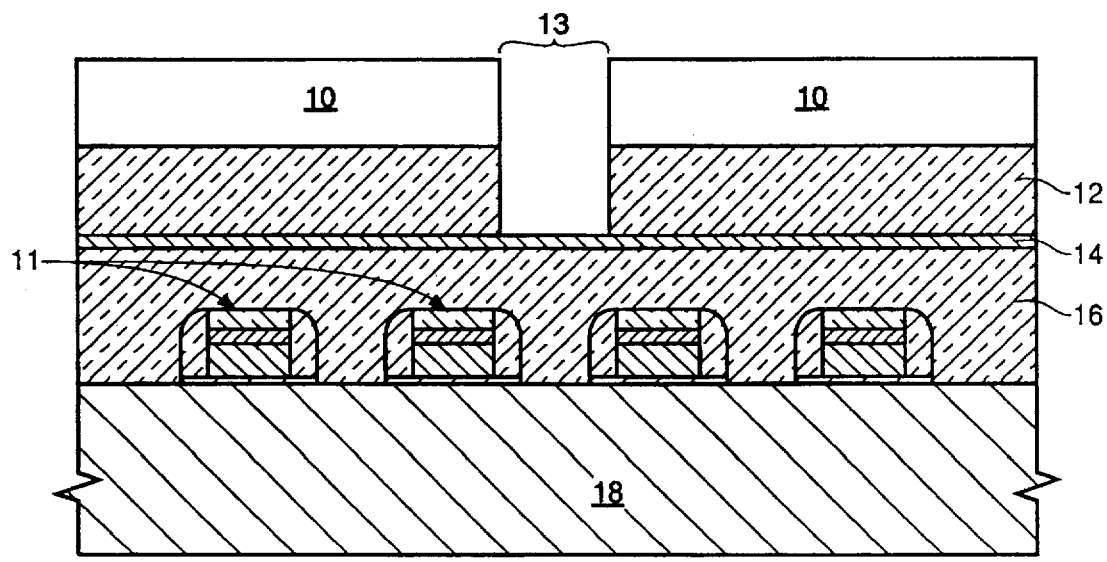
FIG. 2 is a schematic cross-section of the layered substrate of FIG. 1, after the first insulating layer has been etched, according to the process of the present invention.

FIG. 2 illustrates the substantially anisotropic oxide etch which stops on the 1 kÅ poly layer 14. During oxide 12 etch, the exposed oxide 12 is preferably etched by a plasma characterized by a power density of approximately 700 W, a magnetic field of approximately 75 gauss, and an atmosphere of approximately 100 mTorr comprised of approximately 25 sccm $CF_4$, approximately 35 sccm $CHF_3$, and approximately 60 sccm argon. The argon functions to enhance the uniformity of the etch, and is selected for its cost and availability. One having ordinary skill in the art would realize that other inert gases could also be used in the process of the present invention, as well as the various combinations of fluorocarbon based gases such as $C_2F_6$, which are useful for anisotropically etching an oxide.

Figure 3:
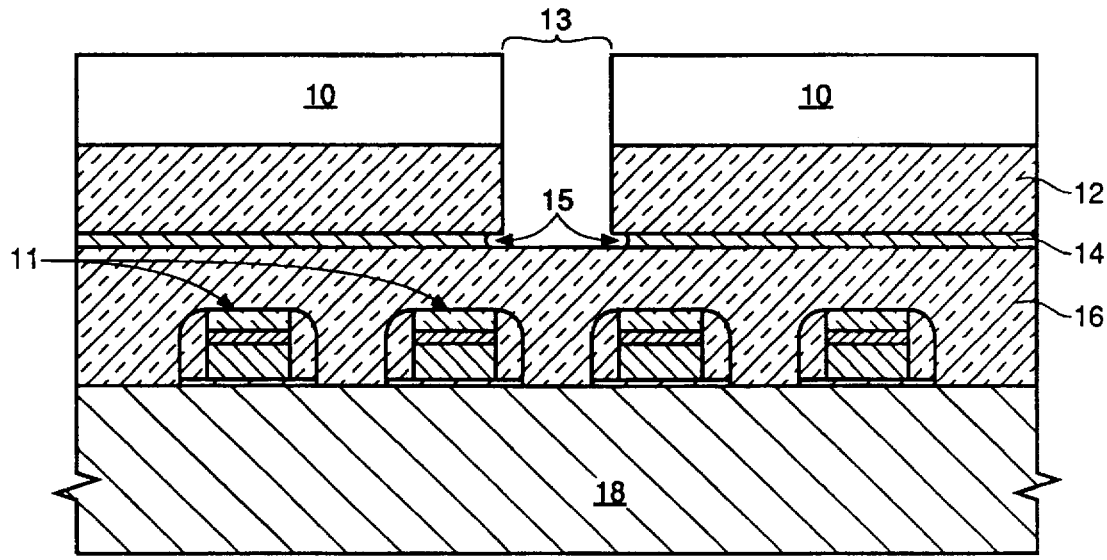
FIG. 3 is a schematic cross-section of the layered substrate of FIG. 2, after the conductive layer has been etched, according to the process of the present invention.

Immediately after the oxide 12 etch step, while in situ, the poly silicon layer 14 is etched with a two-step process. FIG. 3 illustrates the combination of a substantially anisotropic etch and an isotropic poly layer 14 etch which is performed to etch through, and then undercut 15 the poly layer 14. The resulting poly layer 14 The etch employs a halogen such as $Cl_2$, $Br_2$, $F_2$ and/or $I_2$, and preferably $Cl_2$ profile is slightly indented 15 (preferably to approximately 1 kÅ) between the upper and lower oxide layers 12, 14, respectively.

The preferred parameters for the substantially anisotropic portion of the poly layer 14 etch are characterized by a power density of approximately 300 W, a magnetic field of approximately 150 gauss, and an atmosphere of approximately 25 mTorr comprised of approximately 30 sccm $Cl_2$, and approximately 4 sccm $SF_6$.

The preferred parameters for the isotropic portion of the poly layer 14 etch are characterized by a power density of approximately 125 W, a magnetic field of approximately 0 gauss, and an atmosphere of approximately 400 mTorr comprised of approximately 20 sccm $Cl_2$, approximately 5 sccm $He/O_2$, and approximately 30 sccm $SF_6$.

The preferred embodiment of process of the present invention employs the combination of isotropic and anisotropic etches to undercut 15 the polysilicon layer 14. An alternative embodiment includes reversing the order of the anisotropic and isotropic etch steps. A further embodiment is simply to undercut the polysilicon layer 14 with an isotropic etch alone.

Figure 4:
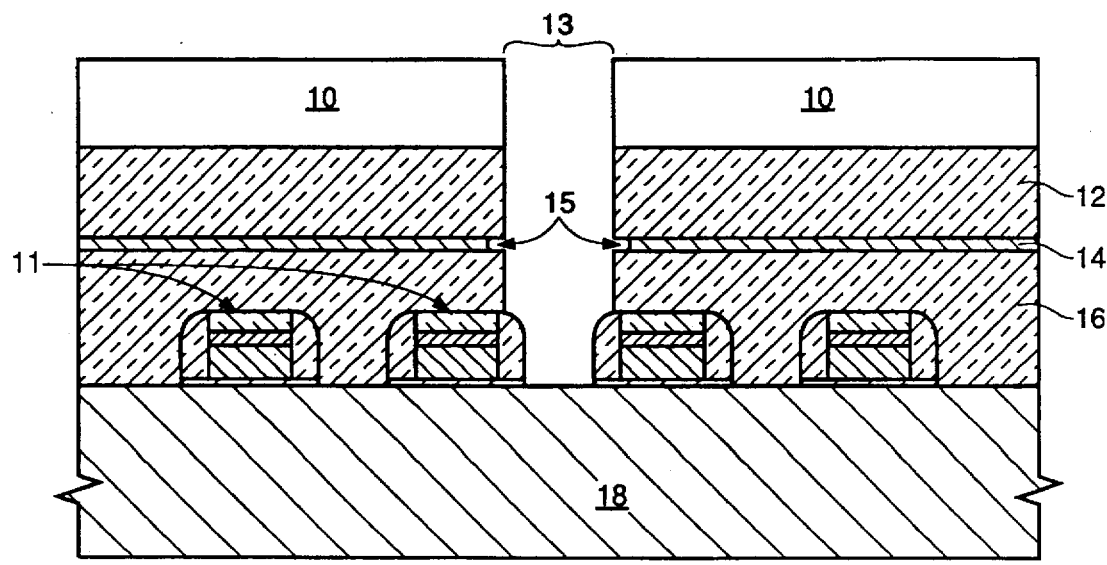
FIG. 4 is a schematic cross-section of the layered substrate of FIG. 3, after the second insulating layer has been etched, according to the process of the present invention.

FIG. 4 illustrates the etch of the lower oxide layer 16 on which a low selective etch is performed until the contact hole 13 reaches the top of the underlying wordlines 11.

During the selective oxide 16 etch, the exposed oxide 16 is preferably etched by a plasma characterized by a power density of approximately 700 W, a magnetic field of approximately 75 gauss, and an atmosphere of approximately 100 mTorr comprised of approximately 25 sccm $CF_4$, approximately 35 sccm $CHF_3$, and approximately 60 sccm argon. Again, $C_2F_6$ may also be included for assisting the oxide etch.

In the case in which the word line 11 is comprised of a nitride film, an alternative embodiment, is to then change to a high oxide to nitride selective etch so, that the oxide layer 16 can be removed at the bottom of the contact hole 13 without exposing the wordline 11. Application Ser. No. 07/898,505, filed on Jun. 15, 1992, and assigned to Micron Technology, Inc., entitled, "Process for Selectively Etching a Layer of Silicon Dioxide on an Underlying Stop Layer of Silicon Nitride" also provides additional description of this etch step.

Once the contact hole 13 is created, an oxidation step may be undertaken to insulate the sides of the contact holes 13 prior to the deposition of a conductive material which conductive material will function as contacts. The indented portion 15 of the contact hole 13 enables the separation of the conductive poly layer 14 from the metal contact, while essentially maintaining a substantially vertical profile. The insulation lining the contact simply fills the indentation 15, and therefore does not significantly encroaching into the contact hole 13.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, one having ordinary skill in the art will realize that a poly equivalent in this process is a refractory metal silicide, such as tungsten silicide. Although the structure disclosed included BPSG derived oxide, tetraethylorthosilicate (TEOS) or any silane derived oxide, for example, may be etched. Nitride of silicon is also considered equivalent to oxide for purposes of the inventive process. These equivalents and others are intended to be circumscribed by these claims.

What is claimed is:

1. A method for etching an insulator/conductor/insulator layered sandwich structure in a single chamber, said method comprising steps of:

disposing said layered sandwich structure in a reactor chamber;

establishing a first atmosphere in said reactor chamber to etch said first insulator and form a profile therein;

establishing a second atmosphere in said reactor chamber, said second atmosphere including provision of an isotropic etch component, to etch said conductor and remove portions of the conductor to form an undercut relative said profile of said first insulator; and establishing a third atmosphere in said reactor chamber to etch said second insulator and form a profile therein;

wherein said method further comprises a step of establishing another atmosphere in said reactor chamber for providing a substantially anistropic etch, and anisotropically etching a preliminary portion of said conductive layer before the establishment of said second atmosphere.

2. The method according to claim 1, wherein said first and third atmospheres comprise a fluorocarbon, said fluorocarbon comprising at least one of $CF_4$, $CHF_3$, and $C_2F_6$.

3. The method according to claim 1, wherein said second and another atmospheres comprise a halogenated species, said halogenated species comprising at least one of $Cl_2$, $Br_2$, $F_2$, and $I_2$.

4. The method according to claim 3, wherein said layered sandwich structure comprises an oxide/polysilicon/oxide sandwich structure.

5. A process for forming a void in a multilayered sandwich structure, said process comprising steps of:

providing a pattern layer upon a substrate, said substrate having an oxide/polysilicon/oxide layered sandwich structure; and selectively removing in accordance with said pattern layer portions of each of said oxide/polysilicon/oxide layers in situ within a given chamber, thereby creating at least one void in said layered sandwiched structure, said at least one void having a sidewall with a profile that is substantially vertical relative a substantially horizontal plane defined by an upper surface of said substrate, said void profile having at least a slight undercut at said polysilicon layer;

wherein at least a portion of said polysilicon layer is removed with a plasma comprising a halogenated species;

wherein said halogenated species comprises approximately 10–40 sccm of $Cl_2$; and wherein said void provides a contact hole, said contact hole being lined with an insulator for isolating, at the undercut, polysilicon of the polysilicon layer from a subsequent conductive material, and subsequently receiving a conductive material therein.

6. A process for forming a void in a multilayered sandwich structure, said process comprising steps of:

providing a pattern layer upon a substrate, said substrate having an oxide/polysilicon/oxide layered sandwich structure; and selectively removing in accordance with said pattern layer portions of each of said oxide/polysilicon/oxide layers in situ within a given chamber, thereby creating at least one void in said layered sandwiched structure, said at least one void having a sidewall with a profile that is substantially vertical relative a substantially horizontal plane defined by an upper surface of said substrate, said void profile having at least a slight undercut at said polysilicon layer;

wherein at least a portion of said polysilicon layer is removed with a plasma comprising a halogenated species;

wherein said halogenated species comprises approximately 10–40 sccm of $Cl_2$; and wherein a preliminary portion of said polysilicon layer is removed anisotropically by plasma in an environment comprising a pressure in a range of 15–30 mtorr and an applied power in a range of 250–350 Watts and a magnetic field in a range of 100–200 gauss.

7. An in situ etch process for etching a conductive layer disposed between insulating layers, said process comprising steps of:

selectively removing portions of an insulator/conductor/insulator layered sandwich structure disposed on a substrate, thereby creating at least one hole in said layered sandwich structure, said at least one hole having a sidewall with a substantially vertical profile relative to a horizontal plane defined by an upper surface of said substrate, said profile having an indentation at said conductive layer relative said insulator layers;

wherein said step of selectively removing comprises:

creating a plasma in said chamber, said plasma comprises a fluorocarbon and an inert gas, said fluorocarbon selective to said substrate and comprises a gas flow of $CF_4$ in a range of 15–30 sccm and $CHF_3$ in a range of 25–40 sccm, and said inert gas comprises a gas flow of argon in a range of 50–70 sccm, and creating another plasma in said chamber, said another plasma comprises a halogenated species, said halogenated species comprises a gas flow of $Cl_2$ in a range of 10–50 sccm and $SF_6$ in a range of 3–40 sccm;

wherein said conductive material comprises polysilicon; and wherein said at least one insulating material comprises at least one of an oxide and a nitride.

* * * * *